(12) United States Patent
Sager (10) Patent No.: US 6,291,930 B1
(45) Date of Patent: Sep. 18, 2001

(54) LOW VOLTAGE PIEZOELECTRIC BENDER ELEMENTS AND UNIT CELLS

(75) Inventor: Frank Everett Sager, Clear Lake Shores, TX (US)

(73) Assignee: Oceaneering International, Inc., Houston, TX (US)

( * ) Notice: Subject to any disclaimer, the term of this patent is extended or adjusted under 35 U.S.C. 154(b) by 0 days.

(21) Appl. No.: 09/611,770

(22) Filed: Jul. 7, 2000

Related U.S. Application Data (63) Continuation-in-part of application No. 09/374,196, filed on Aug. 13, 1999.
(60) Provisional application No. 60/096,392, filed on Aug. 13, 1998.

(51) Int. Cl.$^7$ .................................................. H01L 41/08
(52) U.S. Cl. ........................................... 310/331; 310/366
(58) Field of Search .................................... 310/328, 330, 310/331, 366

(56) References Cited

U.S. PATENT DOCUMENTS

| | | | |
|---|---|---|---|
| 3,946,398 | 3/1976 | Kyser et al. | 310/328 |
| 4,011,474 | 3/1977 | O'Neil | 310/328 |
| 4,140,936 | 2/1979 | Bullock | 310/28 |
| 4,162,511 | 7/1979 | Toda et al. | 358/128 |
| 4,164,756 | 8/1979 | Toda et al. | 358/128 |

(List continued on next page.)

FOREIGN PATENT DOCUMENTS

| | | | |
|---|---|---|---|
| 3833109 | 4/1990 | (DE) | 310/328 |
| 2087659 | 5/1982 | (GB) | 310/328 |
| 2484900 | 4/1975 | (RU) | 310/318 |

OTHER PUBLICATIONS

Toda, "Voltage Induced Large Amplitude Bending Device-PVF$_2$ Bimorph, Its Properties and Application", Piezoelectrics, 1981, vol. 32, pp. 127–133. Dec. 1981.

Nevil et al. "The Potential of Corregated PVDF Bimorphs for Actuation and Sensing" SME Conference, Robotics Research The Next Five Years and Beyond, Aug. 14–16, 1984.

$1^{st}$ page of Memorandum of Agreement obtained Mar. 5, 1996.

Toda et al. "Application of PVF$_2$ Bimorph Cantiliver Elements to Display Devices", Proceeding of S.I.D. vol. 19/2 Second Quarter 1978, pp. 35–41. Dec. 1978.

Toda et al. "Electromotional Devices Using PVF$_2$ Multi-layer Biomorph" Transactions of IECE of Japan, vol. E61, No. Jul. 7, 1978, pp. 507–512.

Toda "Theory of Air Flow Generation by a Resonant Type PVF$_2$ Cantilever Vibrator", Piezoelectrics, 1979, vol. 22, pp. 911–918. Dec. 1979.

* cited by examiner

Primary Examiner—Thomas M. Dougherty
(74) Attorney, Agent, or Firm—Kurt S. Myers (57) ABSTRACT

The present invention is directed to a unique piezoelectric laminate composite which enables the deflection generated to provide greater work energy. The composites of the present invention are fabricated as piezoelectric bender-elements having a mechanical bias or radius of curvature. More specifically, the composite fabrication method of the present invention uses pressure and temperature to bond and anneal a plurality of layers of composite materials including a thin strip of piezoelectric material into piezoelectric bender-elements.

16 Claims, 10 Drawing Sheets

U.S. PATENT DOCUMENTS

| | | | |
|---|---|---|---|
| 4,176,378 | 11/1979 | Toda et al. | 358/128 |
| 4,234,245 | 11/1980 | Toda et al. | 350/269 |
| 4,342,936 | 8/1982 | Mareus et al. | 310/330 |
| 4,351,192 | 9/1982 | Toda et al. | 73/861.18 |
| 4,405,402 | 8/1983 | Quilliam | 156/273 |
| 4,417,169 | 11/1983 | Toda et al. | 310/317 |
| 4,545,553 | 10/1985 | Finke et al. | 310/324 |
| 4,620,124 | 10/1986 | Farrau et al. | 310/332 |
| 4,670,074 | 6/1987 | Bressoux et al. | 156/198 |
| 4,708,600 | 11/1987 | Abutudon, II et al. | 417/322 |
| 4,927,084 * | 5/1990 | Brandner et al. | 310/331 |
| 4,939,405 | 2/1990 | Okuyama | 310/330 |
| 5,113,566 | 5/1992 | Weecamp et al. | 29/25.35 |
| 5,245,242 | 9/1993 | Hall | 310/316 |
| 5,286,199 | 2/1994 | Kipke | 310/311 |
| 5,410,207 | 4/1995 | Miura et al. | 310/328 |
| 5,440,194 | 8/1995 | Beurrier | 310/328 |
| 5,632,841 | 5/1997 | Fox et al. | 156/245 |
| 5,686,777 * | 11/1997 | Chang | 310/328 |
| 5,899,354 | 3/1999 | Sager | 310/331 |
| 6,065,196 * | 5/2000 | Inoe et al. | 310/366 |

Fig. 7

LOW VOLTAGE PIEZOELECTRIC BENDER ELEMENTS AND UNIT CELLS

RELATED APPLICATION

This application is a continuation-in-part application of U.S. patent application Ser. No. 09/374,196, filed Aug. 13, 1999, entitled "Low Voltage Piezoelectric Bender Elements and Unit Cells", which in turn is based on a provisional application for U.S. patent Ser. No. 60/096,392, filed Aug. 13, 1998, entitled "METHOD FOR FABRICATION OF LOW-VOLTAGE HYBRID PIEZOELECTRIC BENDER ELEMENTS".

FIELD OF INVENTION

The present invention is directed to unique laminate composites of piezoelectric material. More specifically, low voltage piezoelectric bender-elements are fabricated using multi-layers of piezoelectric material by bonding the layers in a press and heating the layers to form a bender element with a mechanical bias or curve. A unit cell that provides energy to an electro-motional device is made by placing two bender-elements of the present invention end-to-end, with the mechanical bias in opposite directions, and applying an electric field.

BACKGROUND OF THE INVENTION

The present invention extends the technology incorporated into related U.S. Pat. Nos. 5,761,782; 5,798,600; 5,889,354; and 5,892,314. In each of these patents the piezoelectric material illustrating the inventions therein was a multilayer film of polyvinylidene fluoride (PVDF).

Piezoelectric materials have been used extensively as sensors and acoustical/electric coupling devices. Materials that have been used in these devices are made from films of polymer such as polyvinylidene fluoride (PVDF) which are drawn or stretched while subjecting the polymer film to an electric field. The piezoelectric film will then respond to applied electrical fields by either lengthening or shortening depending upon the direction of the applied field.

In the prior art there are several specific techniques disclosed for making the sensor-elements using piezoelectric films; however, common to those folding the piezoelectric polymer film in multi-layers is the use of an epoxy resin or a glue as an adhesive between film layers. Papers disclosing making sensors using bimorph elements and specific techniques in making the elements are: "Application of PVF$_2$ Bimorph Cantilever Elements to Display Devices", M. Toda and S. Osaka, Proceeding of the S.I.D., Vol 19/2, Second Quarter 1978, pp 35–41; "Electro-motional Device Using PVF$_2$ Multilayer Bimorph", M. Toda and S. Osaka, Transactions of the IECE of Japan, Vol E61 No 7, July 1978, pp 507–512; "Theory of Air Flow Generation By a Resonant Type PVF$_2$ Bimorph Cantilever Vibrator", M. Toda, Piezoelectrics, 1979, Vol 22, pp 911–918; "Voltage-Induced Large Amplitude Bending Device—PVF$_2$ Bimorph—Its Properties and Applications", M. Toda, Piezoelectrics, 1981, Vol 32, pp127–133; and "The Potential of Corrugated PVDF Bimorphs for Actuation and Sensing", Gale E. Nevil, Jr. and Alan F. Davis, SME Conference—Robotics Research: The Next Five Years and Beyond, Aug. 14–16, 1984, Technical Paper MS84-491. When multi-layer piezoelectric polymer film elements were made "the films were bounded together using epoxi-resin (High Super, Cemedine Corp.)" {"Electromotional Devices Using PVF$_2$ Multilayer Bimorph" ,sic. p 509}.

The following patents are all patents of Toda et al. which disclose bimorph elements of piezoelectric materials. U.S. Pat. No. 4,162,511 discloses a pickup cartridge for use in a velocity correction system which includes a polymer bimorph element mechanically interposed between a cartridge housing and a pickup arm carrying a groove-riding stylus. U.S. Pat. No. 4,164,756 discloses a signal pickup stylus which cooperates with an information storing spiral groove on a video disc record which is caused to selectively skip groove convolutions of the disc record to produce special effects. U.S. Pat. No. 4,176,378 discloses a pickup arm pivotally coupled to a housing support at one end thereof and which is coupled to the housing near its other end by means of bimorph elements attached together at right angles. U.S. Pat. No. 4,234,245 discloses a light control device which includes a bimorph element comprising two thin polyvinylidene fluoride films and a thin layer disposed therebetween to secure the films together. U.S. Pat. No. 4,351,192 discloses a piezoelectric, acoustic vibration detecting element which is positioned in a fluid flow to be measured so as to be moved according to the intensity of the fluid flow away from a source of acoustic vibration. U.S. Pat. No. 4,417,169 discloses a photoelectric circuit arrangement for driving a piezoelectric bimorph element to bend and thereby to open or close a window blind according to the quantity of transmitted light through the blind.

U.S. Pat. No. 4,342,936 discloses a piezoelectric flexure mode device (called a "unimorph") comprising a layer of piezoelectric active material bonded to a layer of piezoelectric inactive material.

U.S. Pat. No. 4,405,402 discloses a thick piezoelectric/pyroelectric element made from polarized plastics such as polyvinylidene fluoride.

U.S. Pat. No. 4,670,074 discloses a composite co-laminated piezoelectric transducer with at least one layer of polymeric substance capable of acquiring piezoelectric properties when co-laminated in the presence of an electric field.

U.S. Pat. No. 4,708,600 discloses a piezoelectric fluid pumping apparatus which includes a pumping apparatus incorporating a piezoelectric energizer.

U.S. Pat. No. 4,939,405 discloses a pump comprised of a piezoelectric vibrator mounted in a casing.

U.S. Pat. No. 5,113,566 discloses a method of producing a multilayer piezoelectric element.

SUMMARY OF THE INVENTION

The present invention is directed to a unique piezoelectric laminate composite that enables the deflection generated to provide greater work energy. The composites of the present invention are fabricated as piezoelectric bender-elements having a mechanical bias or radius of curvature. More specifically, the composite fabrication method of the present invention uses pressure and temperature to bond and anneal a plurality of layers of composite materials including a thin strip of piezoelectric material into piezoelectric benderelements.

BRIEF DESCRIPTION OF THE DRAWINGS

FIG. 4 is a schematic illustrating the sine curve of an alternating electric field changing the polarity placed on a unit cell and the corresponding deflection changes of the unit cell; specifically;

FIG. 5(b) in which the polarity of the electric field on the unit cell is reversed and the unit cell is in the contracted state;

FIG. 6 are schematic views of a stack or plurality of unit cells on a backing plate; specifically one view;

BRIEF DESCRIPTION OF THE PREFERRED EMBODIMENTS

Heretofore, piezoelectric elements have principally been used as sensors and the extent of deflection movement of the element has been the major consideration. Thus, mechanical integrity was a minor part of the element. The present invention is directed to the use of laminate composites including piezoelectric materials as a source of work. Thus, the mechanical integrity of the piezoelectric material used is of particular importance. It has been found that the multiple layer piezoelectric bender-elements that specifically have thin strips of piezoelectric material having a high Young's modulus enables the deflection generated by the bender-element to provide greater force and therefore greater work energy. Also the composites of the present invention utilize thin layers of the piezoelectric material such that a low voltage field will activate the deflection of the piezoelectric material and the composite. The piezoelectric bender-elements of the present invention are assembled into piezo-electric unit cells that are used as driving blocks or force sources in many applications such as a piezoelectric pump.

It was disclosed in the related patents U.S. Pat. Nos. 5,761,782; 5,798,600; 5,889,354; and 5,892,314, all incorporated herein by reference, that while a plurality of piezoelectric elements, all working as a single unit, had been used to increase the force of the deflection, the plurality of layers or elements decreased the deflection. To overcome this dilemma, the invention of the related patents used mechanically biased piezoelectric bender-elements (meaning that the bender-elements are curved in their fabrication). Two of these mechanically biased piezoelectric bender-elements are then fabricated into a unit cell wherein the two bender-elements are both mechanically and electrically biased in opposite directions. This basic structure of the unit cell as compared to a single piezoelectric element has at least four times the deflection for a given drive voltage. In addition, by using multi-layered bender-elements in the unit cell, the force was multiplied while retaining the maximum deflection possible for a given drive voltage.

The bender-elements of the present invention are laminated composites that have multilayers of a piezoelectric material; specifically, the thin strips of piezoelectric material are selected from materials that have a high Young's modulus (elastic modulus or modulus of elasticity). Young's modulus is the relationship between stress and strain and is considered to be linear for all materials up to some point. This sweeping generalization and idealization applicable to all materials is known as Hooke's law. This simply means that stress is directly proportional to strain where the constant of proportionality is E, called Young's modulus. Young's modulus or E has the units of stress, i.e. pounds per square inch (psi), in the English system or newtons per square meter (or pascals), in the SI system. Graphically E is the slope of a straight line from the origin to the rather vague point A on a stress-strain diagram of any material. Physically the elastic or Young's modulus represents the stiffness of the material to an imposed load. The value of the Young's modulus is a definite property of a material or stated differently, all materials except nonisotropic materials (i.e. materials having different physical properties in different directions) have a Young's modulus. It has been found that as Young's modulus of the piezoelectric strip increases, subjected to an equivalent electric field and displacement, the reactive force of the bender-element also increases. This greater force through equivalent displacement results in greater work.

Another feature of the present invention is the use of thin strips of piezoelectric material in the bender-elements. This directly translates into the possibility of using low voltage for obtaining the desired activation field strength. The activation field strength is that required for the piezoelectric material to deflect, i.e. that range of field strength to cause deflection but that does not exceed a field strength that causes breakdown or a short. The field strength, E=voltage/thickness of the piezoelectric material. The significance of this relationship is that the thinner the piezoelectric material the lower the voltage necessary to obtain the desired field strength. The dilemma however is that the thinner the piezoelectric material the less the force and therefore the less work that the piezoelectric material provides.

In order to increase force and preserve deflection for a given drive voltage a multilayer or multimorph bender-element is fabricated. To produce a multimorph bender-element of the present invention, a unique laminated composite including a thin layer of piezoelectric material having a high Young's modulus is used.

Figure 1:
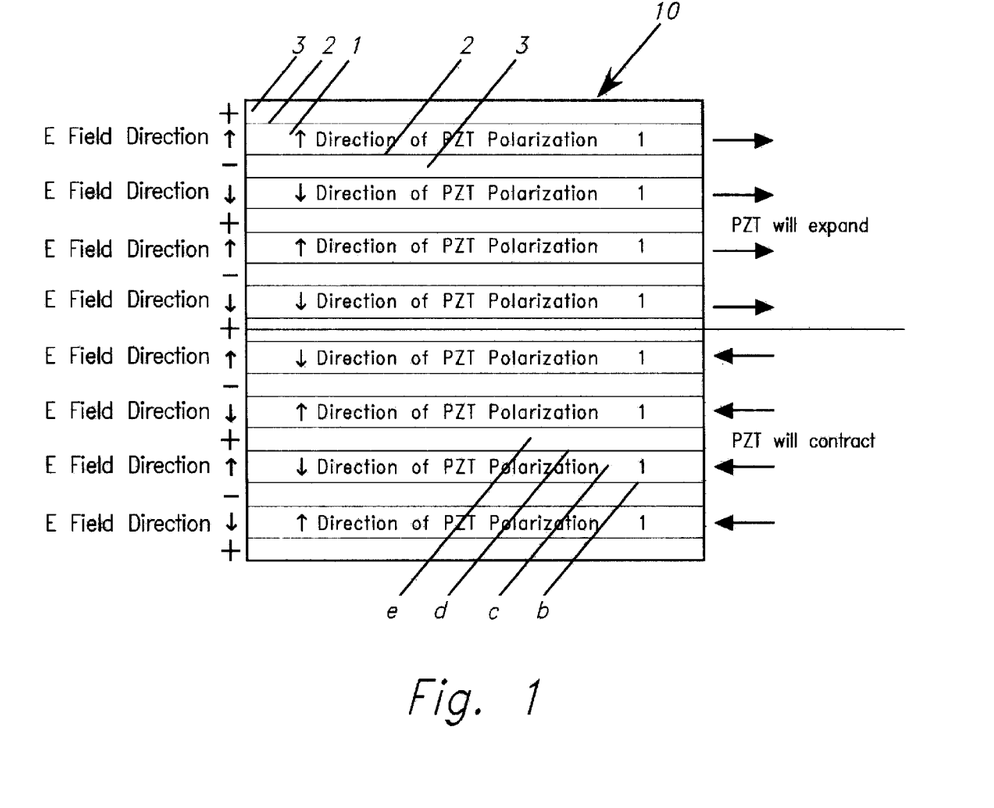
FIG. 1 is a schematic illustrating a laminate composite including thin strips of piezoelectric material of the present invention.
Figures 2, 2A, 2B:
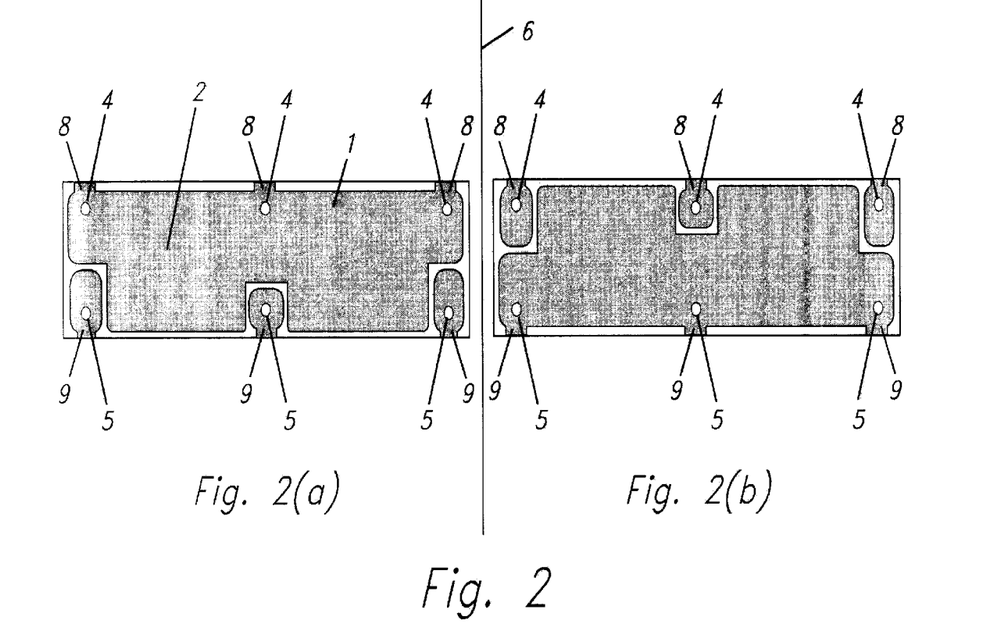
FIGS. 2(A) and 2(B) are top and bottom views of the pattern of the electrode layer used in the preferred embodiment of the laminate composite of a piezoelectric material of the present invention.

A laminate composite 10 of the present invention is illustrated in FIG. 1. A thin strip 1 of piezoelectric material having a high Young's modulus is used in the composite of the present invention. A preferred material is a piezoelectric ceramic material, such as a lead zirconate titanate ceramic (PZT). The piezoelectric ceramics are preferred since they have a Young's modulus of at least $10^9$ newton per meter$^2$. Single crystal piezoelectric materials may also be used because of their high Young's modulus. It is expected that the Young's modulus of these materials may be even larger than the ceramic piezoelectric materials. It is desired that the Young's modulus of the piezoelectric material used in the composite of the present invention be as large as possible. An electrode layer 2 of a highly conductive metal, such as silver, aluminum, platinum, gold, copper or any combination of conductive material is placed on both sides of the piezoelectric strips 1. The electrode layer may be a film of the conductive metal; however, it is preferred that the conductive metal be applied directly to the thin strip of piezoelectric material 1 used in the fabrication of the multimorph bender-elements of the present invention. A further aspect of the present invention is that the application of the conductive metal as a electrode layer 2 is applied to both surfaces of the thin strip 1 of piezoelectric material 1 in the pattern shown in FIG. 2. This unique pattern permits electron passageways 4 and 5 to be drilled through the multimorph bender-elements of the present invention to provide the charge on the strips of piezoelectric material 1. This eliminates the need for electrical connections to each of the electrode layers 2 as will be described in detail hereinafter. A preferred multimorph bender-element of the present invention is rectangular in shape as shown in FIG. 2; however, this shape is not limiting of the present invention. The preferred pattern of the electrode material 2 is shown in FIG. 2 wherein the pattern of one side of piezoelectric material is shown in FIG. 2(*a*) and the other side is shown in FIG. 2(*b*). The thin strip of piezoelectric material 1 is rotated around a center line 6 shown in FIG. 2 to make clear that the pattern on one side and the other side are on opposite long sides of the rectangular bender-element for reasons that will be set forth in detail hereinafter.

Layers of a bonding plastic material 3 are used at the outer layers, or the first and last layer, of the multimorph bender-element of the present invention and between successive piezoelectric and electrode layers as shown in FIG. 1. The bonding plastic material 3 uniquely bonds the ceramic piezoelectric material for producing the preferred multimorph bender-element of the present invention. A preferred bonding plastic material 3 is a highly durable and flexible thermoplastic with a low surface melt temperature. The characteristics of thermoplastics necessary for an effective bonding material 3 is that it is available in thin films, has a high durability to flex and has a low surface melt temperature. Thermoplastics are insulators; however, it has been found that the flexible and durable bonding properties are the important and necessary characteristics that the plastic bonding material 3 bring to the composites of the present invention. A preferred material is a Kapton® (a registered trademark of Lectromat, Inc. of Mars Pa.) high temperature polyimide film coated on both sides with a B-stage epoxy resin 3'.

Figure 3:
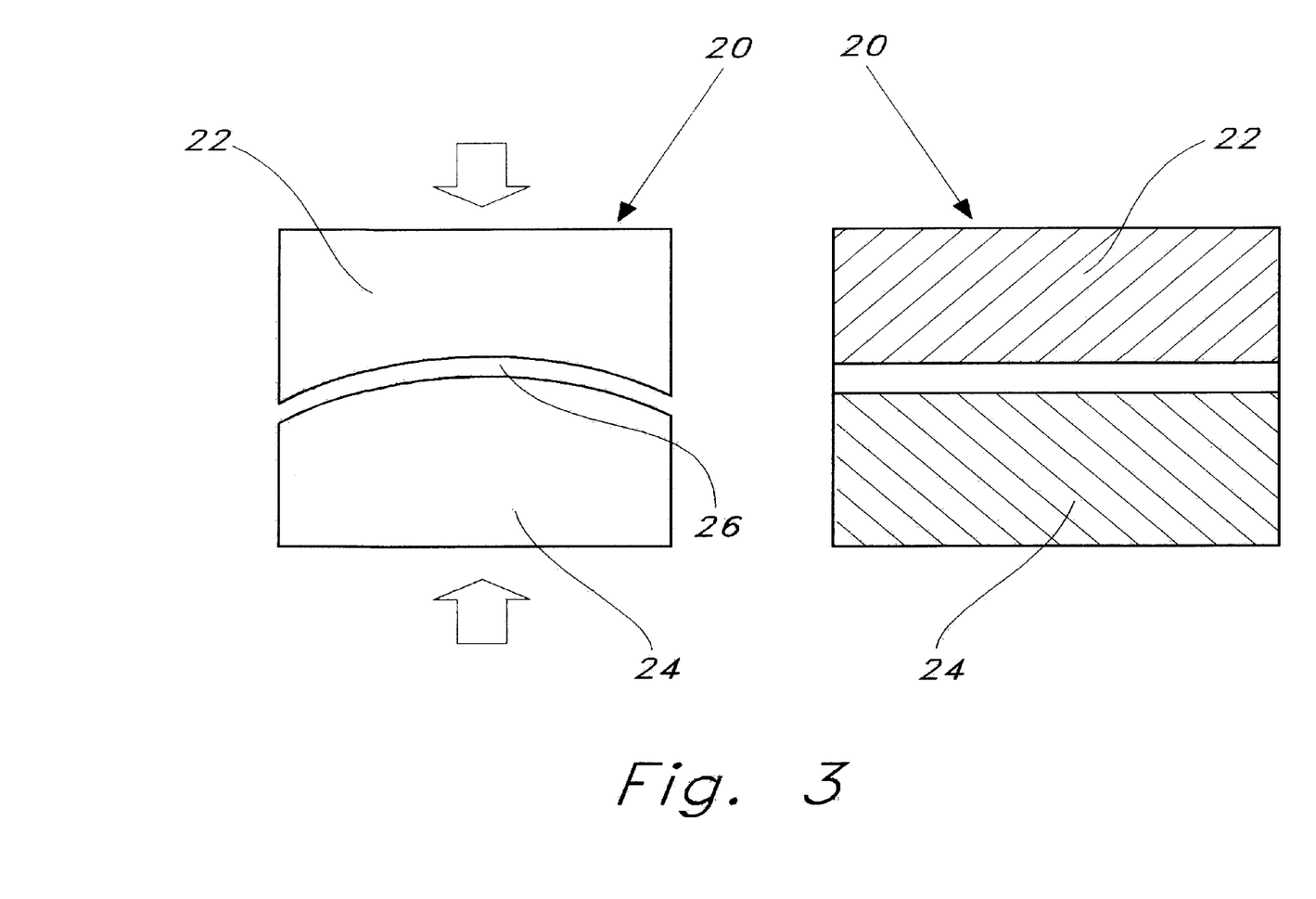
FIG. 3 is a cross-sectional and end view of a press with jaws having a size and shape to bond a bender-element with a desired radius of curvature.

The fabrication method of the present invention involves first, forming the composite by stacking the layers of the piezoelectric material 1, the electrode material 2 and the bonding material 3 as shown in FIG. 1, and then, bonding the composite of the present invention by heating while under pressure in a press as shown in FIG. 3 to produce a multimorph bender-element with a mechanical bias or a radius of curvature. In forming the composite as shown in FIG. 1, it is noted that alternate strips of piezoelectric material 1 are placed on the stack with one with the pattern as shown in FIG. 2(*a*) on the top and the next with the pattern of FIG. 2(*b*) on the top. This continues until half the strips of piezoelectric material 1 are placed on the stack and then the orientation of the piezoelectric material 1 is reversed by placing the next strip with the same orientation and then alternating the orientation of the strips of piezoelectric material 1.

Referring now to FIG. 3, a stack of layers making up the composite 10 of the present invention are positioned into a press 20 having an upper jaw 22 and lower jaw 24. A preferred set of jaws 22 and 24 have a slight radius of curvature or curved portion 26 to fabricate the bender-elements with a mechanical curvature or bias. The composite as shown in FIG. 1 is positioned between upper jaw 22 and lower jaw 24. The jaws 22 and 24 of the press 20 are closed and as much pressure as required is applied to the composite. The pressure may range from 100 pounds per square inch (psi) to 10,000 psi. The press 20 and the composite is then subjected to a heating cycle to bond the layers, such as placing the compressed composite into a low temperature oven. The temperature of the oven may range from 35° C.(95° F.) to 300° C.(572° F.). The temperature selected is less than a temperature that will effect the poling of the piezoelectric material (no more than ½ the Curie temperature of the piezoelectric material)if poling of the piezoelectric has already been done. However, it is understood that the poling of the piezoelectric material may be done after the laminate composite is made. The bonding temperature then is selected to obtain efficiency in the bonding step, a temperature to plasticize the surface of the thermoplastic bonding material 3. At the higher temperatures the composite in press 20 is left in the oven for a shorter time, approximately a half hour, while at the lowest temperatures the press 20 will be kept in the oven for as long as 12 hours. The press 20 is then removed from the oven and without removing the compression on the films, is air cooled to room temperature which anneals the bender-element. The bonded and annealed composite is removed from the vice as a multi-layered bender-element 30 having a desired mechanical bias or curved shape. After removing the bender-element 30 from the vice 20, small holes 4 and 5 are drilled through the multiple layers in the centers of the rectangles of the electrode layers 2 applied to the piezoelectric material 1. A hypodermic syringe filled with a spreadable conductive fluid, such as silver ink, is inserted into each hole 4 and 5 to line the holes or openings with a continuous electrode surface. This procedure may be done more than once to assure that a continuous electrode surface is obtained in each opening passing through the bender-element. While only one hole 4 or 5 is shown in FIG. 2 in each rectangle, more than one hole may be drilled in the rectangles of the pattern and coated with the silver ink to provide electron passageways. Attention is directed to FIG. 2, tabs 8 extend from the top surface of the piezoelectric element 1 from the electrode layer 2 to the isolated rectangles on the bottom of the piezoelectric member. Likewise tabs 9 extend from the isolated rectangles on the top of the piezoelectric member 1 to the bottom surface of the piezoelectric member 1. The significance of the pattern design is to provide the continuity of the electron path through the entire laminated composite but more importantly isolating the polarity of that electrical path on the opposite side of the piezoelectric material 1. Referring to FIG. 1, the composite 10 of the present invention has a layer of the piezoelectric material 1 with the plus charge, when subjected to a voltage source, on one side and a negative charge on the other with alternating layers reversed with the exception of the middle layers. The pattern provides this alternating surface charge configuration. The small rectangular regions are to isolate the polarity of the electrode material 2 on each side of the piezoelectric material 1. A conductive pole or bolt may be placed through one or more of the holes 4 and 5 and a voltage source applied, such as a battery, with the conductive pole in holes 4 attached to one source, such as the positive, and the pole in holes 5 attached to the other source, such as the negative. The pattern design further provides ease of connection to a voltage source since the leads may be directly inserted into one or more holes, provided one lead is electrically attached into one or more holes 4 and the opposite lead is electrically attached in one or more holes 5. The voltage source will provide each surface of the piezoelectric members 1 a field direction as shown in FIG. 1. After completing the assembly of the bender-element, the continuity of the multimorph bender-element is tested. A simple test is to apply an electrical field and if the multi-layered or multimorph bender-element expands or contracts then the bender-element has the desired electrical continuity.

Figure 4A:
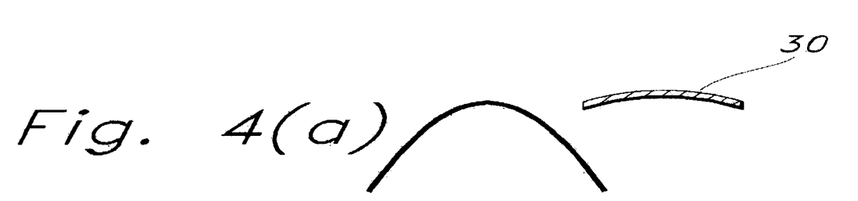
FIG. 4(a) illustrates the deflection of the unit cell at one extreme of polarity.
Figure 4B:
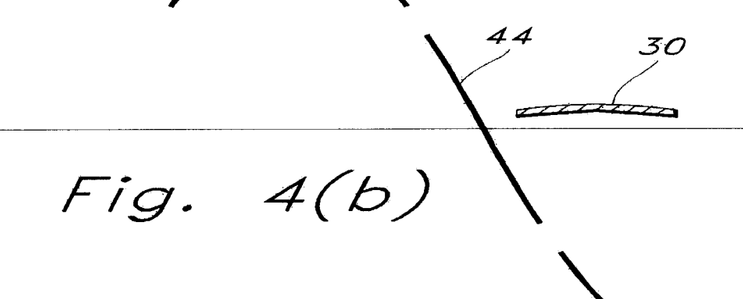
FIG. 4(b) illustrates, the unit cell with no deflection due to polarity.
Figure 4C:
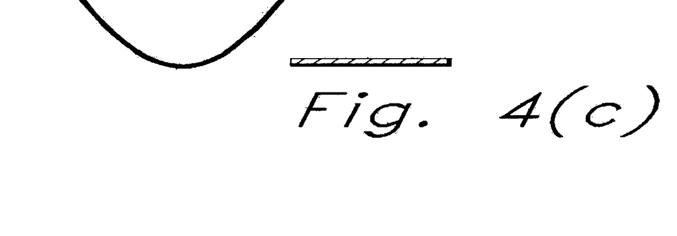
FIG. 4(c) illustrates the deflection of the unit cell at the other extreme of polarity.

As shown in FIG. 4, the natural state of the laminated bender-element 30 is that of FIG. 4(*b*), i.e. having a curvature or mechanical bias such as shown. When the polarity of an applied field is in one direction, the bender-element as shown in FIG. 4(*a*) is in the expanded state and when the polarity is reversed, the bender-element as shown in FIG. 4(*c*) is in the contracted state. The multi-layered bender-element 30 from an electrical viewpoint acts as a capacitor and resistor in the electrical circuit.

Figure 5:
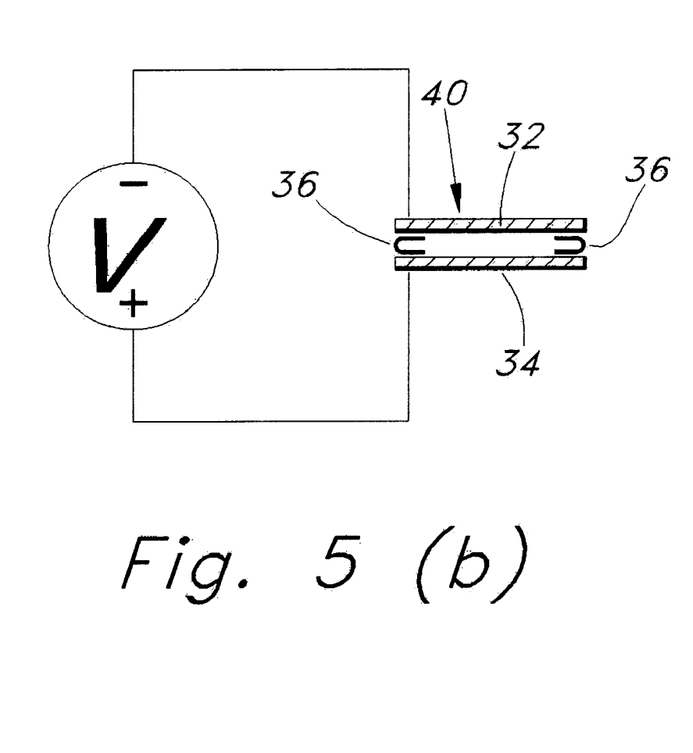
FIG. 5 are schematic views illustrating the piezoelectric unit cell of the present invention; specifically one view.
Figure 5A:
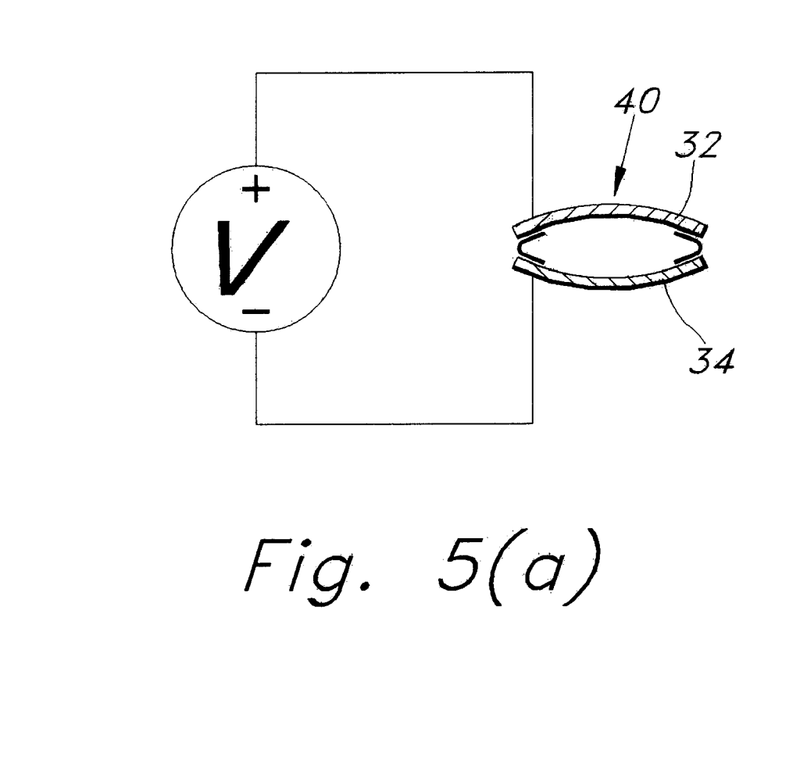
FIG. 5(a), with an electrical polarity which provides a field across the bender-elements of the unit cell and the unit cell is in the expanded state; the second view.

The configuration of a piezoelectric unit cell 40 is illustrated in FIG. 5. In the preferred embodiment, at least two multi-layered bender-elements 30 are placed end-to-end, specifically bender-element 32 and 34, with the ends held together with a compliant hinge 36 and the mechanical bias or curvature of each bender-element is in the opposite direction. The unit cell 40 in which the bender-elements 32 and 34 are in the contracted state is shown in FIG. 5*b*. It becomes clear that the fabricated bender-elements 30 must have a bias when fabricated to make a unit cell 40 so that when the polarity of the field across each of the bender-elements 30 results in the bender-elements being in their contracted state, the two bender-elements will not come into contact with one another. Stated differently, a unit cell 40 of the present invention has a greater deflection potential than if only one polarity can be placed on bender-elements 30 of a unit cell 40. FIG. 5(*a*) illustrates the unit cells 40 with an opposite field polarity across bender-element 32 and bender-element 34. The advantage of having two biased or curved bender-elements is that when subjected to an electrical field the unit cell 40 has much greater deflection than a single bender-element. When the current applied to the unit cell 40 alternates in polarity, illustrated by the sine wave 42 shown in FIG. 4, or the polarity of the field across the two bender-elements is reversed using the same voltage, the unit cell 40 will expand as shown in FIG. 5(*a*). It can be seen that when the voltage polarity on the unit cell 40 is reversed from that shown in FIG. 5(*a*), the unit cell 40 in FIG. 5(*b*) becomes almost flat, thus obtaining the greatest deflection between the two peaks of the sine wave 42. Without the bias or curvature at the rest position of the bender-elements 32 and 34 which make the unit cell 30, a circuit which reverses the field on the unit cell cannot be used. Therefore, without increasing the magnitude of the voltage used, but reversing the polarity, the deflection of the unit cell 40 can be doubled. This enables the unit cell 40 of the present invention to have a much greater application of uses. This configuration of two bender-elements held together with the mechanical and electrical bias in opposite directions is the prime aspect of the unit cell of the present invention regardless of the construction of the bender-elements whether uni-morph or multimorph.

The upper bender-element 32 and the lower bender-element 34 of unit cell 40 are held together with a compliant hinge 36 such as a piece of tape or a plastic holder. When an electrical field is placed across the two bender-elements 32 and 34 of the unit cell 40, the bender-elements are arranged to deflect in the opposite direction. Only a single field is required for the unit cell 40, since the two bender-elements 32 and 34 are electrically in parallel, to obtain the desired maximum deflection of the unit cell 40. Preferably, a piezoelectric unit cell 40 is symmetrical having the same number of layers in each of the bender-elements 30 of the top bender-element 32 and the bottom bender-element 34. However, an asymmetrical unit cell 40 may also be fabricated. The unit cell 40 has an application for any linear motion use.

Figure 6A:
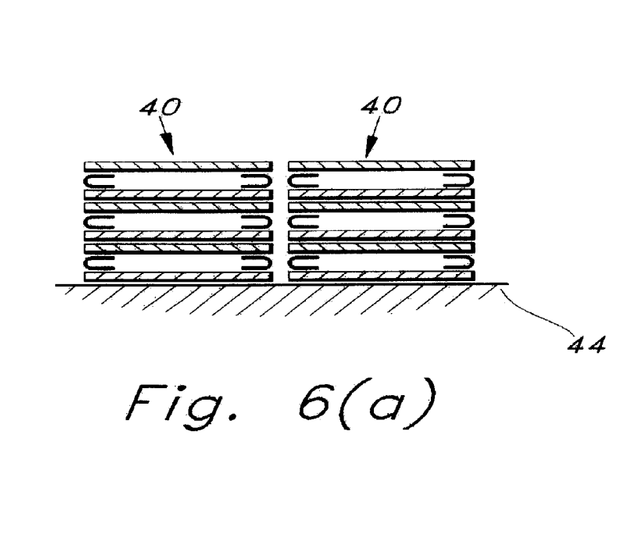
FIG. 6(a), with an initial electrical polarity which contracts the unit cells and the other view.
Figure 6B:
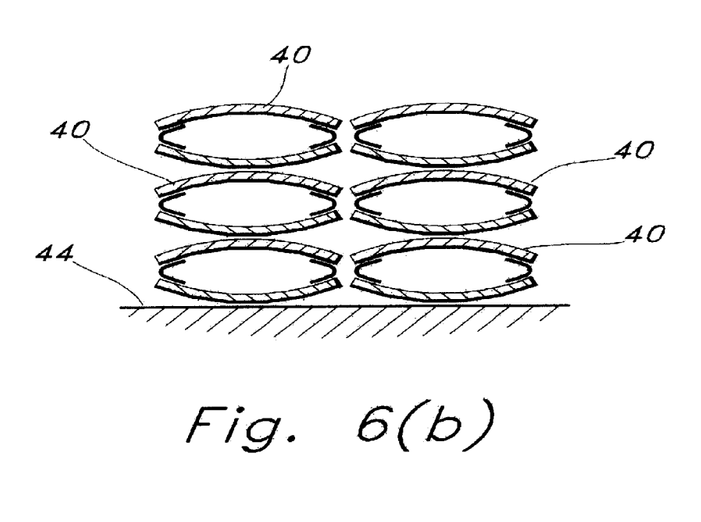
FIG. 6(b), with an opposite electrical polarity providing a field across the bender-elements which expands the unit cells.

Referring now to FIG. 6, the linear electro-motional application of a unit cell 40 is illustrated. However, instead of using a single unit cell 40, a plurality of unit cells 40 may be stacked one on the other to obtain a greater displacement per unit force when the plurality of cells 40 are subjected to an electrical field and deflection of each unit cell 40 occurs. The unit cells 40 are shown stacked on a backing plate 44. This structure of a plurality of unit cells 40 and a backing plate 44 is basic to many alternatives for the remaining structure to which the unit cells 40 are put to use. For example, when the force of the deflection of the unit cells 40 is desired in a specific direction, the backing plate 44 may represent a fixed structure from which the deflection occurs. On the other hand, the stack of unit cells 40 may have a movable member extending across the top of the stack and the backing plate 44 represents such a member, for example a membrane or a piston actuator which will receive the force of the deflection and move with the upper surface of the top unit cell as the field is applied and removed or the polarity of the field is reversed. Still further, if the stack of unit cells 40 have a fixed upper structure, the deflection will cause a force on the backing plate 44 to move downward and represents the movable structure or the structure against which the force is applied. It is apparent that there are many variations that are possible to benefit from the deflection of a single or a stack of unit cells 40 and therefore the force of the unit cell 40.

Figure 7:
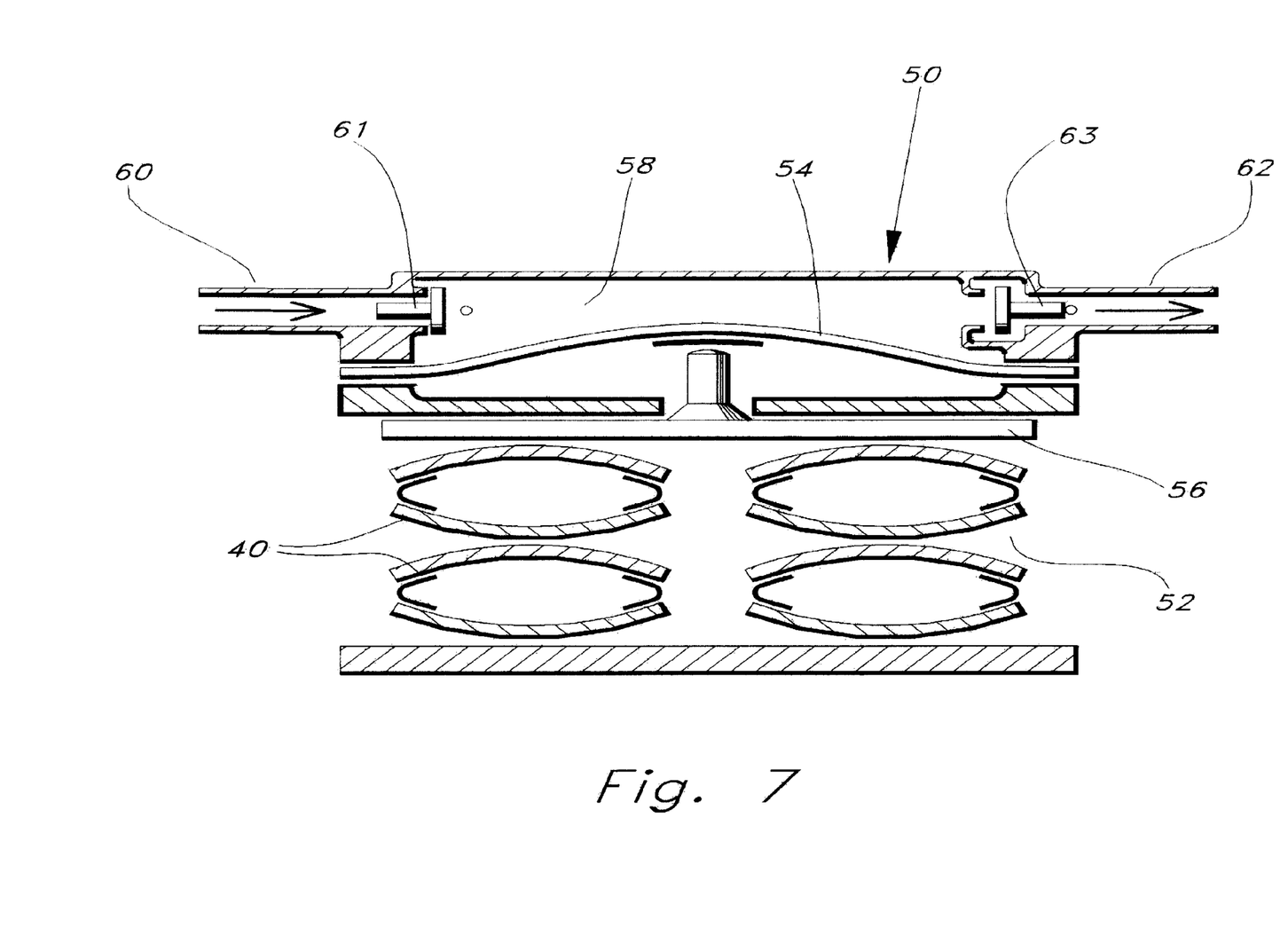
FIG. 7 is a schematic view which illustrates a simple piezoelectric electro-motional device with a plurality of unit cells acting as the drive block for a single chamber pump, the pump in cross-section without the outside housing.

One specific electro-motional embodiment is a piezoelectric pump as shown in FIG. 7. The pump 50 in its simplest form has a housing (not shown) with a drive block chamber 52 containing side-by-side unit cells 40 and preferably a plurality or stack of unit cells 40. At the top of chamber 52 is a diaphragm 54. The unit cells 40 may be in direct contact with the diaphragm 54 or as shown are in contact with a piston 56. An accumulator chamber 58 is at the top portion of the housing of pump 50. A fluid inlet 60 has an inlet check valve 61 for fluid entering the accumulator chamber 58. At the outlet of accumulator chamber 58 is a fluid outlet 62 having an outlet check valve 63. As shown, the unit cells 40 are in their expanded state causing an upward force to be applied to the piston 56 and diaphragm 54 forcing the fluid out of the accumulator chamber 58. When the polarity of the field across the unit cells 40 is reversed, the unit cells 40 contract from the position shown and remove the force on the diaphragm 54 permitting fluid to flow into the chamber 58.

The piezoelectric pumps of the present invention can have a variety of configurations. For example, a multichambered pump with chambers in series or multichambered pump with chambers in parallel or combinations thereof.

The present invention is more fully set forth and illustrated by the following examples:

EXAMPLE I

A composite stack is assembled using rectangular layers of the same dimension beginning with a layer of high durability thermoplastic, for example, Kapton® high temperature polyamide film coated on both sides with a B-stage epoxy resin as the bonding material. A 5 mil thick strip of lead zirconium titanate (PZT a product of the Motorola Corporation) is coated on each side with aluminum metal of the pattern shown in FIG. 2 and cut into rectangular strips. The edges of the piezoelectric strips are coated with a suitable electrode metal, for example sputtering an aluminum metal, to provide the tabs 8 and 9 also shown in FIG. 2. This strip is laid on the stack having the pattern of FIG. 2(b) on top. This is followed with another layer of the Kapton® film. Then another strip of PZT is placed on the stack; however, this layer is turned over (around a centerline as illustrated in FIG. 2) as compared to the first strip of PZT. The pattern of electrode material on top of the second strip of piezoelectric material is as shown in FIG. 2(a) and the direction of polarization of the second strip is opposite that of the first strip. Thus, assuming a composite with eight layers of piezoelectric strips, after four alternating layers of the plastic bonding material and four layers of the piezoelectric material are placed on the stack, a layer of bonding material and a PZT strip are next placed on the stack. However, the orientation of this PZT strip placed on the stack is the same as the previous layer of PZT. The alternating layers of bonding material and piezoelectric material continues with the alternating orientations of the PZT until four additional layers of PZT are placed on the stack. The last layer is a layer of the Kapton® film. What has been described in this Example I is shown in FIG. 1.

Figure 1A:
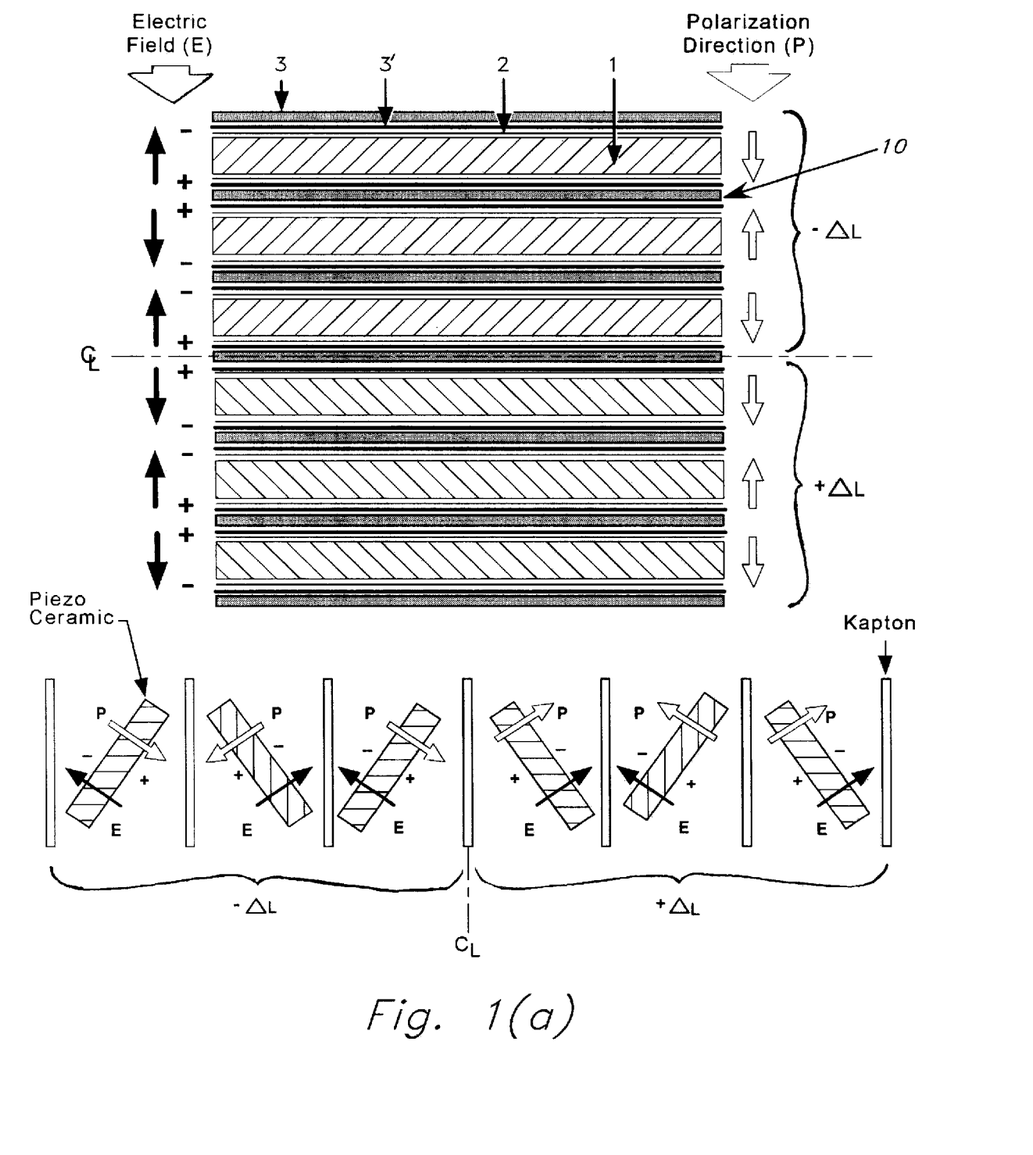
FIG. 1a is a schematic illustrating one embodiment of a laminate composite of the present invention, illustrated by thin strips of a ceramic piezoelectric material (PZT) separated by thin strip of plastic bonding material (Kapton®)

Referring now to FIG. 1a, a composite stack 10 is shown that is the same as the stack 10 shown in FIG. 1 but has six strips of PZT rather than eight. The stack of layers are: (a) a layer of plastic film (Kapton®); (b) an electrode layer; (c) a thin strip of piezoelectric material (PTZ); (d) another layer of electrode material; (e) another layer of plastic film and the stack continues with successive layers of (b), (c), (d), and (e). The pictorial representation of the thin strips of ceramic piezoelectric material (PZT) illustrates the alternating polarization of the strips except at the centerline and the electron flow with a given voltage.

The composite 10 or stack of layers is placed into a vice with curved jaws. The vice is closed applying as much pressure as required. The vice is placed in an oven and heated at 160° C. (320° F.) for four hours to bond the layers. Without removing the pressure, the vice is removed from the oven and allowed to air cool to room temperature.

The bonded and annealed bender-element is removed from the vice. Holes 4 and 5 are drilled in the bender-element, the holes lined with a suitable conductive material (silver ink from Emerson and Cumming Specialty Polymers) and then is tested for continuity of the multimorph by applying a field on the bender-element and observing the deflection.

This example illustrates the method of fabricating the laminate composite bender-elements of the present invention.

While the example may infer that the method is done by hand, this is not necessary, since all steps may be automated and both the fabrication and deposition of the layers may be done in an automated deposition process.

EXAMPLE II

Following the same procedure as set forth in Example I, a stack is made with the difference that the thickness of the piezoelectric material was 2 mil.

The voltage used to activate the bender-element of this example was 50 volts as compared to 120 volts for the 5 mil thickness of the piezoelectric material in Example I.

This example illustrates that the thinner the piezoelectric material in the biased bender-element, the less voltage is required to activate the bender-element of the present invention. By adding more layers with thinner strips of piezoelectric material, a bender-element has greater reactive force without increased operating voltage.

EXAMPLE III

A pair of bender-elements fabricated by the method of Example I or II are placed in juxtaposition to one another such that an applied field will cause the deflection to be in opposite directions. The ends of each biased bender-element is fixed to the corresponding ends with plastic hinges. Suitable hinges may be made from acrylic Excelon™ obtainable from Craftics Incorporated of Chicago, Ill. An applied field causes the deflection of the pair of bender-elements as shown in FIG. 5.

This example illustrates the piezoelectric unit cell of the present invention. An acceptable circuit for use with the piezoelectric unit cells of the present invention is set forth in related patent U.S. Pat. No. 5,892,314 referred to herein above.

In examples I or II above, the plastic bonding material serves a variety of purposes. The plastic bonding materials may be selected from a wide variety of plastics that are capable of being formed as a thin film (mils of thickness) that provide durability and toughness to the final composite. Many thermoplastics and other polymers are capable of being formed as thin films to provide the bonding plastic flexibility required. The key to the composites of the present invention is the use of a piezoelectric material having a high Young's modulus, such piezoelectric materials include, but are not limited to, Lead Zirconium Titanate (PZT), single crystal piezoelectric materials, and other non-polymer ferroelectric and ferro-restrictor materials.

The plastic bonding layers serve to reduce and nearly eliminate initial formation of stress cracks in the high Young's modulus piezoelectric thin layers, the plastic layers prevent the propagation of any cracks that may form. The prevention of propagation extends the fatigue life of the resultant composite compared to a composite that does not incorporate plastic layers. The plastic layers also facilitate large-scale deflection without damaging the high Young's modulus piezoelectric materials of the composite. If the plastic bonding material was not present at the interface of the piezoelectric material, stress cracks would occur, and this would quickly result in electrode arcing and system failure. The composites 10 of the present invention are perforated to allow electrical continuity between the various layers of the composites making the bender elements 30. The plastic bonding materials are insulators but the characteristic of the plastic bonding materials that is important is the flexible bonding that is imparted to the composites of the present invention.

Figure 1B:
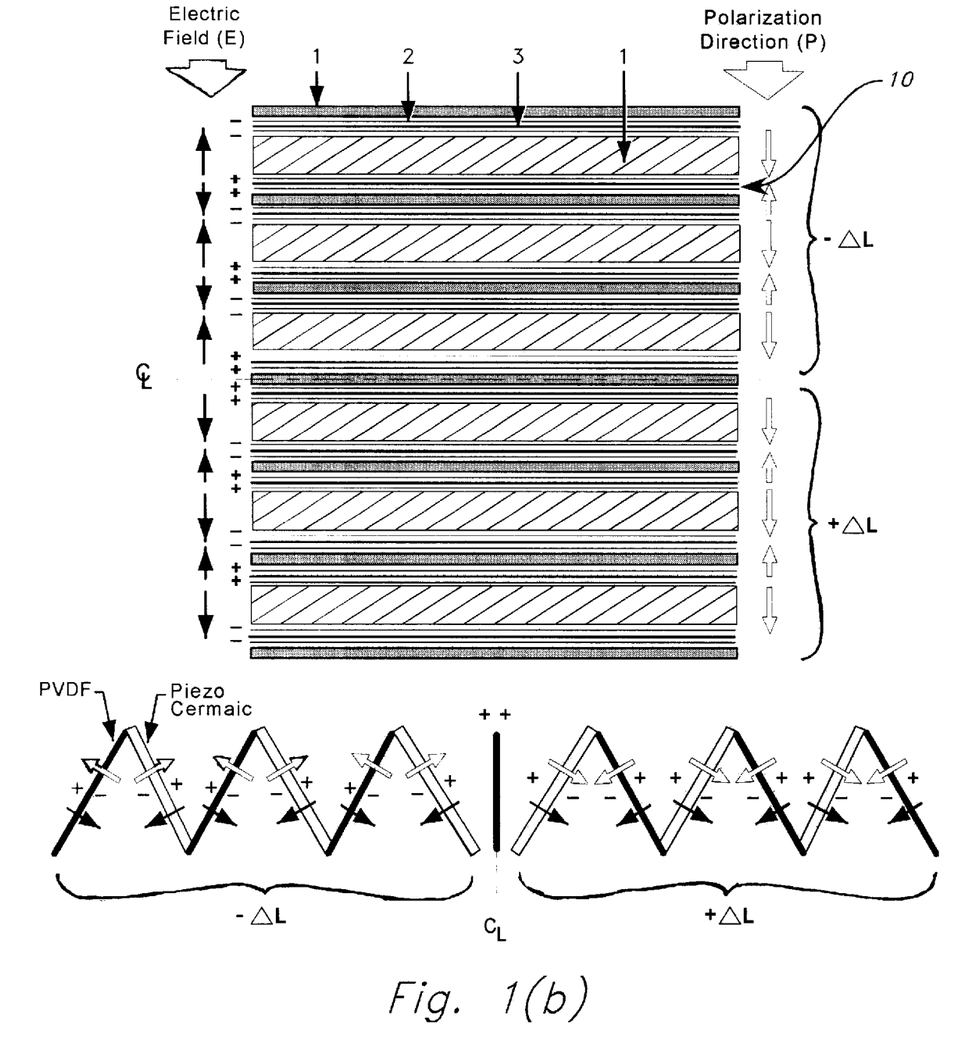
FIG. 1b is a schematic illustrating a preferred embodiment of a laminate composite of the present invention, illustrated by thin strips of ceramic piezoelectric material (PZT) separated by thin strips of a plastic piezoelectric material (PDVF)

The preferred embodiment of the present invention is a stack 10 that includes thin strips of piezoelectric material having a high Young's modulus and further thin layers of a plastic piezoelectric material, as is illustrated in FIG. 1b. These composites of the present invention are made similarly to the composites 10 of FIG. 1 or 1a except that the plastic bonding layer is replaced with a thin layer of a plastic piezoelectric material. This embodiment is illustrated by a composite 10 having thin layers of a piezoelectric material having a Young's modulus, such as the ceramic lead zirconate titanate (PZT) and thin layers of a plastic piezoelectric material, such as a film of polyvinylidene fluoride (PVDF). Added strength, and thus improved differential pressure, is obtained in the composites 10 that incorporates ceramic piezoelectric material (PZT) and plastic piezoelectric material (PVDF). The ceramic piezoelectric material, when embedded in the plastic piezoelectric material, acquires durability from the plastic piezoelectric material, while adding strength to the composite. As the surfaces of the ceramic and plastic piezoelectric materials diffuse into each other during the composite forming process, the ceramic piezoelectric material is less subject to brittle failure; cracks do not propagate; however, more importantly, in this example there are two active piezoelectric materials.

EXAMPLE IV

A composite stack is assembled using rectangular layers of the same length and width beginning with a thin layer of plastic piezoelectric material (a film of PVDF). The initial plastic piezoelectric film has an electrode pattern as shown in FIG. 2 on one side, the side of the PVDF film that will contact the high Young's modulus piezoelectric material (Lead Zirconium Titanate (PZT)) as shown in FIG. 1b. The PVDF layer has an activation field strength defined as $E_{A\ (PVDF)} = V/t_{PVDF}$ where: V is the applied voltage and $t_{PVDF}$ is the thickness of the PVDF film. The adjacent PZT layer has an activation field strength defined as $E_{A\ (PZT)} = V/t_{PZT}$. Where: V is the applied voltage and $t_{PZT}$ is the thickness of the PZT. All piezoelectric materials have their own activation field strength and any composite of the present invention must maintain the two piezoelectric material thickness ratios in accordance with this relationship so that both piezoelectric materials are activated at the same applied voltage. The activation field strength of the PVDF ($E_{A\ (PVDF)}$) is ten times greater than the activation field strength for the PZT ($E_{A\ (PZT)}$). Therefore, the ratio of thickness of the PVDF layer to the PZT layer is one (1) to ten (10). The maximum applied voltage is the same on all elements of the final composite and therefore fixed. Therefore, the thickness of the PVDF and the thickness of the PZT are the only parameters that can be manipulated to assure that all of the piezoelectric elements are exposed to the appropriate activation field strength. The present example is intended to operate at 120 volts. The thickness of the piezoelectric material, the PVDF layer is 12.7 microns thick and the PZT layer has a thickness of 127 microns, and the thickness ratios in this example reflect a composite that when subjected to an applied voltage of 120 volts will activate both piezoelectric materials.

Figure 1C:
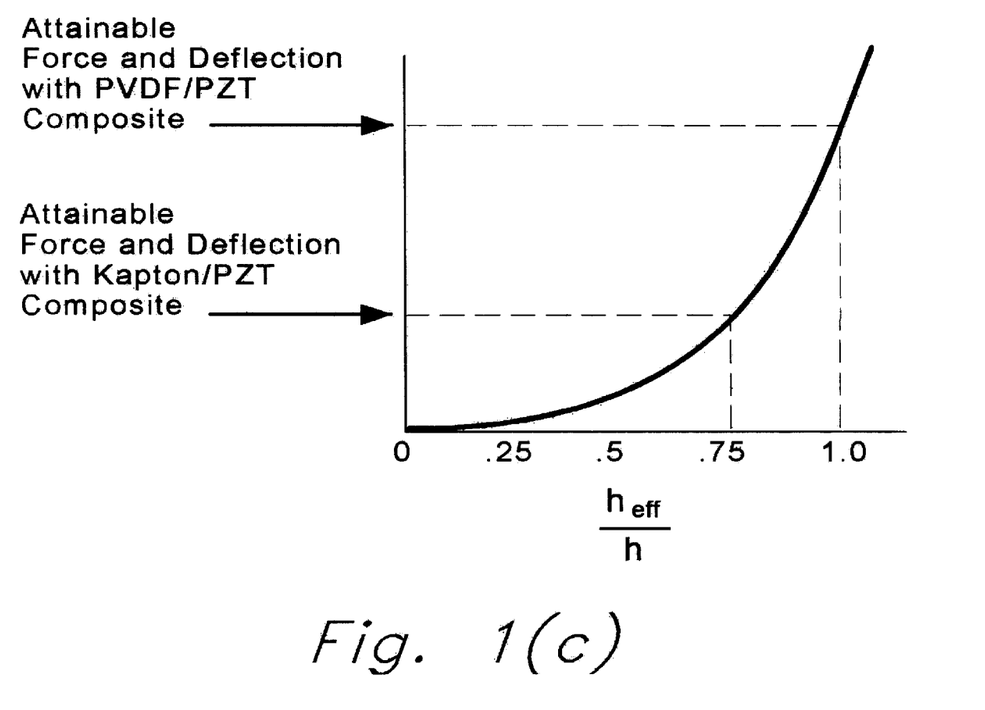
FIG. 1c is a figure illustrating the attainable force and deflection with a PVDF/PZT composite (FIG. 1a) compared to a Plastic/PZT composite (FIG. 1b)

The pattern of successive layers in this example is similar to the pattern described in EXAMPLES I, with the exception that the bonding plastic layers are thin films of PVDF. Each thin layer of PZT and PVDF have their own applied electrode coatings that may be in the pattern as described in FIG. 2. Successive layers of PVDF and PZT are alternated as shown at the bottom of FIG. 1c.

The stack 10 of layers that results from following the pattern shown in FIG. 1b is placed into a vice with curved jaws. The vice is closed to apply as much pressure as required. The vice is then placed in an oven and heated to activate and bond the B-stage epoxy thus forming a single bonded and annealed bender element. The vice is removed from the oven and cooled. The bonded and annealed bender element is removed from the vice. Holes 4 and 5 (FIG. 2) are drilled into the bender element. The holes are lined with a conductive material. The resulting bender element is then tested for continuity by applying an electric field and observing bender-element deflection. Two such bender elements are assembled into a unit cell 40 as shown in FIG. 5.

In examples I and II, the bonding plastic material or plastic films in the composites 10 are piezoelectrically inactive. Because the interstitial plastic films are piezoelectrically inactive, they do not contribute directly to the ultimate force or deflection generated by the application of an electric field. The principle difference between Example IV and the previous Examples is that the interstitial plastic layers are piezoelectric material. As a result of using a piezoelectrically active polymer as the interstitial layer in this example IV, the resulting cross-section of the composite bender element is nearly 100% piezoelectric active material. This is due to the fact that the inactive electrode surfaces and the inactive B-stage epoxy layers constitute less than 1% of the resulting composite cross-section. The composite disclosed in this example results in a normalized effective or active cross-section of one (1) as described in FIG. 1c. This preferred embodiment of the present invention allows the design of composite bender elements with the maximum possible force and deflection for any given operating voltage. Furthermore, this innovation allows the design of bender elements with high force and displacement outputs that are not limited by low operating voltage.

The piezoelectric unit cells of the present invention have a wide potential of uses. As an actuator, the piezoelectric pump may provide solutions to control problems in robotics, bioengineering, advanced remote control, and telepresence technologies.

The piezoelectric electromechanical device of the present invention besides being used in a pump may be used as an actuator, such as any linear short stroke actuator, which may fill the demand for output devices that are more energy efficient, rugged, economical and easier to control than conventional actuators.

These examples of different types of pumps illustrate the versatility of the kinds of pumps which are available and the various operations of the unit cells of the present invention. The pumps may have applications as a heart pump, metering pump for medications, or numerous other applications.

What is claimed is:

1. A piezoelectric laminate composite which comprises:
   (a) a layer of a bonding plastic material;
   (b) a layer of electrode material;
   (c) a thin strip of piezoelectric material;
   (d) a layer of electrode material; and
   (e) a layer of bonding material;
      wherein electron passageways pass through said said laminate composite.

2. A piezoelectric laminate composite which comprises additional layers of (b)–(e) according to claim 1.

3. A piezoelectric laminate composite according to claim 2 wherein the Young's modulus of the thin strip of piezoelectric material is greater than $10^9$ Newton per meter$^2$.

4. A piezoelectric laminate composite according to claim 2 wherein the Young's modulus of the thin strip of piezoelectric material is greater than $10^{10}$ Newton per meter$^2$.

5. A piezoelectric laminate composite according to claim 1 wherein said plastic material is a plastic piezoelectric material.

6. A piezoelectric bender-element which comprises:
   a composite having a first portion which comprises:
   (a) a layer of bonding plastic material;
   (b) a layer of electrode material;
   (c) a thin strip of piezoelectric material having a high Young's modulus;
   (d) a layer of electrode material; and
   (e) a layer of bonding plastic material,
   wherein the direction of polarization of said piezoelectric material in said composite alternates in each successive layer of piezoelectric material until the mid-point layer of bonding plastic material in said composite; and
said composite continuing as a second portion which comprises:
   (a) a layer of bonding plastic material;
   (b) a layer of electrode material;
   (c) a thin strip of piezoelectric material having a high Young's modulus;
   (d) a layer of electrode material; and
   (e) a layer of bonding plastic material,
   wherein the direction of polarization of said piezoelectric material in said composite alternates in each successive layer of piezoelectric material and having an equal number of composite layers as said first portion, the direction of polarization of each layer of piezoelectric material on either side of said mid-point layer of bonding plastic material has the same direction.

7. A piezoelectric bender-element according to claim 6 having a radius of curvature.

8. A piezoelectric bender-element according to claim 6 wherein said electrode surface is applied to said piezoelectric material in a specific isolating pattern that allows electrode passages to be drilled through the composite.

9. A piezoelectric bender-element according to claim 8 wherein said bender-element is essentially rectangular and said pattern of electrode material is a smaller rectangle that exposes the edges of said strip of piezoelectric material and also exposes a small rectangular portion of said piezoelectric material at two corner edges of the longer side of said rectangle and as a U at the middle of said rectangle between and on the same side as said corner edges.

10. A piezoelectric bender-element according to claim 8 wherein electron passageways pass through said bender-element into the rectangular pattern of said electrode surface.

11. A piezoelectric bender-element according to claim 6 wherein said bonding plastic material is a plastic piezoelectric material.

12. A method for the fabrication of piezoelectric bender-elements which comprises:
    positioning laminate composite according to claim 11 in a press; and
    applying pressure to said composites while heating in compression and cooling said compressed and heated composite to bond and anneal said laminate composite.

13. A method according to claim 12 wherein said press has a curvature and said press imparts a radius of curvature to said bender-element.

14. A piezoelectric unit cell which comprises:
    a first piezoelectric bender-element according to claim 7, said bender-element being multi-layer and mechanically biased;
    a second piezoelectric bender-element according to claim 7, said bender-element being multi-layer and mechanically biased, said first and second bender-elements being placed end-to-end whereby said first piezoelectric bender-element is mechanically biased in one direction and said second piezoelectric bender-element is mechanically biased in an opposite direction of said first bender-element; and
    means for preventing separation of said ends of said two bender-elements.

15. A piezoelectric bender-element according to claim 11 having a radius of curvature.

16. A piezoelectric unit cell which comprises:
    a first piezoelectric bender-element according to claim 11, said bender-element being multi-layer and mechanically biased;
    a second piezoelectric bender-element according to claim 11, said bender-element being multi-layer and mechanically biased, said first and second bender-elements being placed end-to-end whereby said first piezoelectric bender-element is mechanically biased in one direction and said second piezoelectric bender-element is mechanically biased in an opposite direction of said first bender-element; and
    means for preventing separation of said ends of said two bender-elements.

* * * * *